(12) United States Patent
Choi et al.

(10) Patent No.: US 7,442,604 B2
(45) Date of Patent: Oct. 28, 2008

(54) METHODS AND BATCH TYPE ATOMIC LAYER DEPOSITION APPARATUS FOR FORMING DIELECTRIC FILMS AND METHODS OF MANUFACTURING METAL-INSULATOR-METAL CAPACITORS INCLUDING THE DIELECTRIC FILMS

(75) Inventors: Jae-Hyoung Choi, Hwaseong-si (KR); Jung-hee Chung, Suwon-si (KR); Se-hoon Oh, Hwaseong-si (KR); Jong-cheol Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 259 days.

(21) Appl. No.: 11/376,384

(22) Filed: Mar. 15, 2006

(65) Prior Publication Data

US 2006/0216947 A1 Sep. 28, 2006

(30) Foreign Application Priority Data

Mar. 23, 2005 (KR) .............. 10-2005-0024071
Jul. 29, 2005 (KR) .............. 10-2005-0069664

(51) Int. Cl.
    *H01L 21/8242* (2006.01)
(52) U.S. Cl. .............. 438/240; 438/785; 257/E21.396
(58) Field of Classification Search .............. 438/240, 438/758, 761, 763, 785; 257/E29.345, E21.396
    See application file for complete search history.

(56) References Cited

U.S. PATENT DOCUMENTS 6,835,674 B2  12/2004  Doan et al.
2003/0013320 A1  1/2003  Kim et al.
2004/0266217 A1*  12/2004  Kim et al. .............. 438/778
2005/0039680 A1*  2/2005  Beaman et al. .............. 118/715
2006/0176645 A1*  8/2006  Ahn et al. .............. 361/311

FOREIGN PATENT DOCUMENTS

| JP | 2001-25418 A | 9/2001 |
| KR | 2003-0002775 A | 1/2003 |
| KR | 10-2004-0058902 A | 7/2004 |
| KR | 10-2005-0002011 A | 1/2005 |
| KR | 10-2005-0012638 A | 2/2005 |

* cited by examiner

*Primary Examiner*—Brook Kebede
(74) *Attorney, Agent, or Firm*—Myers Bigel Sibley & Sajovec, PA

(57) ABSTRACT

Provided are methods of manufacturing dielectric films including forming a first dielectric film on a wafer using atomic layer deposition (ALD) in a first batch type apparatus, forming a second dielectric film on the first dielectric film using atomic layer deposition in a second batch type apparatus, wherein the second dielectric film has a higher crystallization temperature than the first dielectric film and forming a third dielectric film on the second dielectric film using atomic layer deposition in a third batch type apparatus. Methods of manufacturing metal-insulator-metal (MIM) capacitors using the methods of forming the dielectric films and batch type atomic layer deposition apparatus for forming the dielectric films are also provided.

32 Claims, 9 Drawing Sheets

METHODS AND BATCH TYPE ATOMIC LAYER DEPOSITION APPARATUS FOR FORMING DIELECTRIC FILMS AND METHODS OF MANUFACTURING METAL-INSULATOR-METAL CAPACITORS INCLUDING THE DIELECTRIC FILMS

CROSS-REFERENCE TO RELATED APPLICATION

This application claims the benefit of Korean Patent Application Nos. 10-2005-0024071, filed Mar. 23, 2005, and 10-2005-0069664, filed Jul. 29, 2005. The disclosures of these applications are incorporated herein by reference in their entirety as if fully set forth herein.

FIELD OF THE INVENTION

The present invention relates to methods and batch type atomic layer deposition (ALD) apparatus for forming dielectric films and methods of manufacturing metal-insulator-metal (MIM) capacitors including the dielectric films.

BACKGROUND OF THE INVENTION

A structure including titanium nitride film/hafnium oxide film/titanium nitride film ($TiN/HfO_2/TiN$) has been suggested for formation of a capacitor having a reduced leakage current and an increased capacitance. Since a capacitor including a $TiN/HfO_2/TiN$ structure may be less expensive and may further possess a lower current density than a structure including ruthenium film/tantalum oxide film/ruthenium film ($Ru/TaO_2/Ru$), which is representative of a metal-insulator-metal (MIM) capacitor, the $TiN/HfO_2/TiN$ structure may be applied to a semiconductor memory device that may be limited to a design rule of 100 nm or less. However, a capacitor having the $TiN/HfO_2/TiN$ structure may generate a larger leakage current during a back-end process.

To address this problem, a layer, such as an aluminum oxide ($Al_2O_3$) layer, may be disposed between hafnium oxide ($HfO_2$) layers in order to delay crystallization of the $HfO_2$ layers as discussed in Korean patent application No. 2004-0067433. Since the crystallization temperature of the $Al_2O_3$ layer may be higher than that of the $HfO_2$ layers, crystallization of the $HfO_2$ layers may be delayed at least in part because of the increase of the total crystallization temperature of the capacitor dielectric film when the back-end process is performed at a higher temperature, thereby reducing or preventing generation of the larger leakage current.

Since the entire thickness of a conventional hafnium oxide film/aluminum oxide film/hafnium oxide film ($HfO_2/Al_2O_3/HfO_2$) structure is about 100Å or less, a single type atomic layer deposition (ALD) apparatus may be used for depositing the films. However, since a respective process may be performed for each wafer when the single type ALD apparatus is used, formation of dielectric films on several wafers may require additional time, resulting in a lower throughput.

Additionally, in order to reduce operation time, the $HfO_2/Al_2O_3/HfO_2$ structure may be deposited in-situ at about 250 to 350° C. in order to form a conventional MIM capacitor. However, when the $Al_2O_3$ film is deposited at about 250 to 350° C., the film may be thermally degraded such that a sufficiently high crystallization temperature of the $Al_2O_3$ film may not be obtained. Therefore, the $Al_2O_3$ film may not increase the crystallization temperature of the capacitor dielectric film.

Further, MIM capacitors may be formed on 200 mm caliber wafers, and increasingly, on 300 mm large caliber wafers. However, MIM capacitors formed on 300 mm large caliber wafers using conditions for forming MIM capacitors on 200 mm wafers may render it problematic to obtain optimized MIM capacitors.

SUMMARY OF THE INVENTION

The present invention provides methods of forming a dielectric film on larger caliber wafers, which can reduce or prevent leakage current of the dielectric film during a higher temperature process and improve the throughput of a device. The present invention also provides methods of manufacturing a metal-insulator-metal (MIM) capacitor using the methods of forming the dielectric film. The present invention further provides apparatus for forming the dielectric films.

According to some embodiments, the present invention provides methods of manufacturing a dielectric film including forming a first dielectric film on a wafer using atomic layer deposition in a first batch type apparatus, forming a second dielectric film on the first dielectric film using atomic layer deposition in a second batch type apparatus, wherein the second dielectric film has a higher crystallization temperature than the first dielectric film and forming a third dielectric film on the second dielectric film using atomic layer deposition in a third batch type apparatus. In some embodiments, forming the first dielectric film, the second dielectric film, and the third dielectric film include chemically absorbing a first reaction source into the wafer, purging a chemically unabsorbed residual first reaction source, pumping a reaction space where an atomic layer is deposited to remove the unpurged residual first reaction source, supplying a second reaction source to react with the first reaction source to form an atomic layer, purging the unreacted residual second reaction source and pumping the reaction space to remove the unpurged residual second reaction source.

According to some embodiments of the present invention, methods of manufacturing a metal-insulator-metal (MIM) capacitor include forming a plurality of lower electrodes on a semiconductor substrate, loading a plurality of semiconductor substrates having the lower electrodes formed in a first batch type apparatus and forming first dielectric films using atomic layer deposition, loading a plurality of semiconductor substrates having the first dielectric films formed in a second batch type apparatus and forming second dielectric films on the first dielectric films using atomic layer deposition, wherein the second dielectric films have a higher crystallization temperature than the first dielectric films, loading a plurality of semiconductor substrates having the second dielectric films formed in a third batch type apparatus and forming third dielectric films on the second dielectric films using the atomic layer deposition and forming upper electrodes on the third dielectric films.

According to some embodiments of the present invention, methods of manufacturing a dielectric film include forming a plurality of first dielectric films on a plurality of wafers with at least one repetition of supplying a first reaction source, purging, pumping, supplying a second reaction source, purging, and pumping; forming a plurality of second dielectric films on the plurality of wafers on each of which a first dielectric film is formed with at least one repetition of supplying a third reaction source, purging, pumping, supplying a fourth reaction source, purging, and pumping and forming a plurality of third dielectric films on the plurality of wafers on each of which a second dielectric film is formed simultaneously with at least one repetition of supplying a fifth reaction source, purging, pumping, supplying a sixth reaction source, purging, and pumping, wherein the first dielectric films and the second dielectric films are formed in different chambers.

According to some embodiments of the present invention, methods of manufacturing a dielectric film include forming a plurality hafnium oxide layers on a plurality of wafers at a first temperature with at least one repetition of supplying a hafnium source, purging, pumping, supplying a oxygen source, purging, and pumping; forming a plurality of aluminum oxide layers on the plurality of wafers on each of which a hafnium oxide layer is formed at a second temperature, which is higher than the first temperature with at least one repetition of supplying an aluminum source, purging, pumping, supplying a oxygen source, purging, and pumping; and forming a plurality of hafnium oxide layers on the plurality of wafers on each of which an aluminum oxide layer is formed simultaneously at the first temperature with at least one repetition of supplying a hafnium source, purging, pumping, supplying a oxygen source, purging, and pumping, wherein the first dielectric films and the second dielectric films are formed in the different chambers.

According to further another aspect of the present invention, there is provided a batch type atomic layer deposition (ALD) apparatus for depositing dielectric films, the apparatus includes: a plurality of tubes; a wafer boat which is installed in each of the tubes and has a plurality of wafers; and at least one supply pipe transporting a reaction source to each wafer in the each of the tubes, wherein a gas spraying outlet, such as nozzle can be installed at each position of the supply pipe corresponding to a wafer slot. In some embodiments, the number of the supply pipes may be equal to the number of the reaction sources employed to manufacture the dielectric films.

DETAILED DESCRIPTION

Figure 1A:
FIGS. 1A through 1G present cross-sectional views illustrating stages of a method of manufacturing a metal-insulator-metal (MIM) capacitor according to some embodiments of the present invention.

The present invention will now be described more fully hereinafter with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. The terminology used in the description of the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise. Also, as used herein, "and/or" refers to and encompasses any and all possible combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms, including technical and scientific terms used in this description, have the same meaning as commonly understood by one of ordinary skill in the art to which this invention belongs. All publications, patent applications, patents, and other references mentioned herein are incorporated by reference in their entirety.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

In the drawings, the thickness of layers and regions are exaggerated for clarity. It will also be understood that when a layer is referred to as being "on" another layer or substrate or a reactant is referred to as being introduced, exposed or feed "onto" another layer or substrate, it can be directly on the other layer or substrate, or intervening layers can also be present. However, when a layer, region or reactant is described as being "directly on" or introduced, exposed or feed "directly onto" another layer or region, no intervening layers or regions are present. Additionally, like numbers refer to like compositions or elements throughout.

Embodiments of the present invention are further described herein with reference to cross-section illustrations that are schematic illustrations of idealized embodiments of the present invention. As such, variations from the shapes of the illustrations as a result, for example, of manufacturing techniques and/or tolerances, are to be expected. In particular, the regions illustrated in the figures are schematic in nature and their shapes are not intended to illustrate the precise shape of a region of a device and are not intended to limit the scope of the present invention.

As will be appreciated by one of ordinary skill in the art, the present invention may be embodied as compositions and devices including the compositions as well as methods of making and using such compositions and devices.

A method of ex-situ formation of a dielectric film including a hafnium oxide layer/aluminum oxide layer/hafnium oxide layer ($HfO_2/Al_2O_3/HfO_2$) structure using a batch type atomic layer deposition (ALD) method is provided. The use of the batch type ALD method for forming a dielectric film can improve throughput of semiconductor memory devices and may further deposit the dielectric film in an optimized state due, at least in part, to the ex-situ formation of the dielectric film. Accordingly, desirable layer characteristics of a dielectric film used for a capacitor can be obtained. In addition, since depositing sources for the dielectric film can be sufficiently supplied, at least in part, due to the employment of the batch type ALD method, step coverage of the dielectric film can be improved, and leakage current can be reduced or prevented.

Additionally, a pumping process after a purging process is further provided to deposit an enhanced quality capacitor dielectric film on a large caliber wafer, such as a 300 mm wafer, in the batch type ALD apparatus. Thus, residual atomic layers and impurities remaining after the purging process is performed can be removed to a desirable extent during the pumping process, and thus, a single atomic layer can be provided.

Further, the batch type ALD apparatus includes supply pipes, i.e., injectors having nozzles in wafer slots, which can contribute to uniform distribution of the reaction gas onto a plurality of wafers.

Capacitor dielectric films, metal-insulator-metal (MIM) capacitors including the dielectric films, and batch type ALD apparatus according to embodiments of the present invention will be described in detail with reference to the accompanying drawings.

FIGS. 1A through 1G present cross-sectional views illustrating stages of methods of manufacturing a MIM capacitor according to some embodiments of the present invention. Referring to FIG. 1A, a lower electrode 110 is formed on a semiconductor substrate (not illustrated), for example, a silicon wafer onto which a semiconductor device is formed. The wafer may be a suitable large caliber wafer such as a 300 mm wafer. The lower electrode 110 may include a metal nitride layer including titanium nitride (TiN), tungsten nitride (WN), and tantalum nitride (TaN), or a metal, such as ruthenium (Ru), platinum (Pt), iridium (Ir) or a combination thereof. In some embodiments of the present invention, a titanium nitride layer is used as the lower electrode 110. The lower electrode 110 may be formed utilizing chemical vapor deposition (CVD), atomic layer deposition (ALD) or sequential flow deposition (SFD).

The semiconductor substrate onto which the lower electrode 110 is deposited may be loaded into a dielectric film deposition apparatus so as to deposit a first dielectric film on the lower electrode 110. According to some embodiments of the present invention, a batch type ALD apparatus is employed as a dielectric film deposition apparatus.

Figure 2:
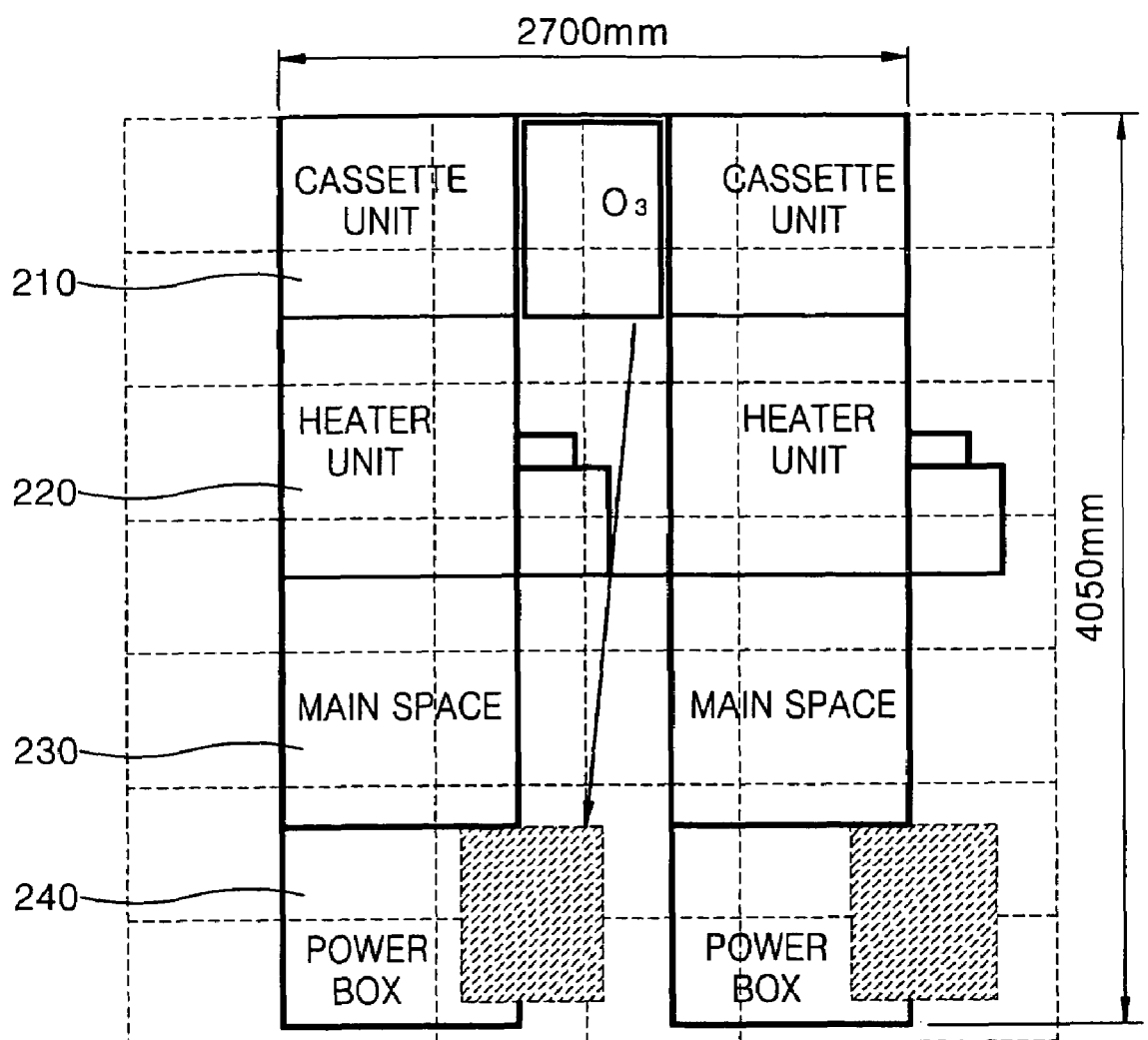
FIG. 2 presents a schematic of two batch type atomic layer deposition (ALD) apparatus, which are arranged as one set, according to some embodiments of the present invention.

FIG. 2 presents a schematic showing two batch type atomic layer deposition (ALD) apparatus which are arranged as one set according to some embodiments of the present invention. The batch type ALD apparatus may include a cassette unit 210, a heater unit 220, a main space 230 including, but not limited to, a batch type ALD chamber, and a power box 240. Two batch type ALD apparatus, i.e., a first batch type ALD apparatus and a second batch type ALD apparatus, may be arranged as a pair, as illustrated in FIG. 2. The area of the pair of batch type ALD apparatus is about 2700 mm by 4050 mm, which is generally smaller than a conventional single type ALD apparatus of about 3900 by 3200 mm.

Figure 3:
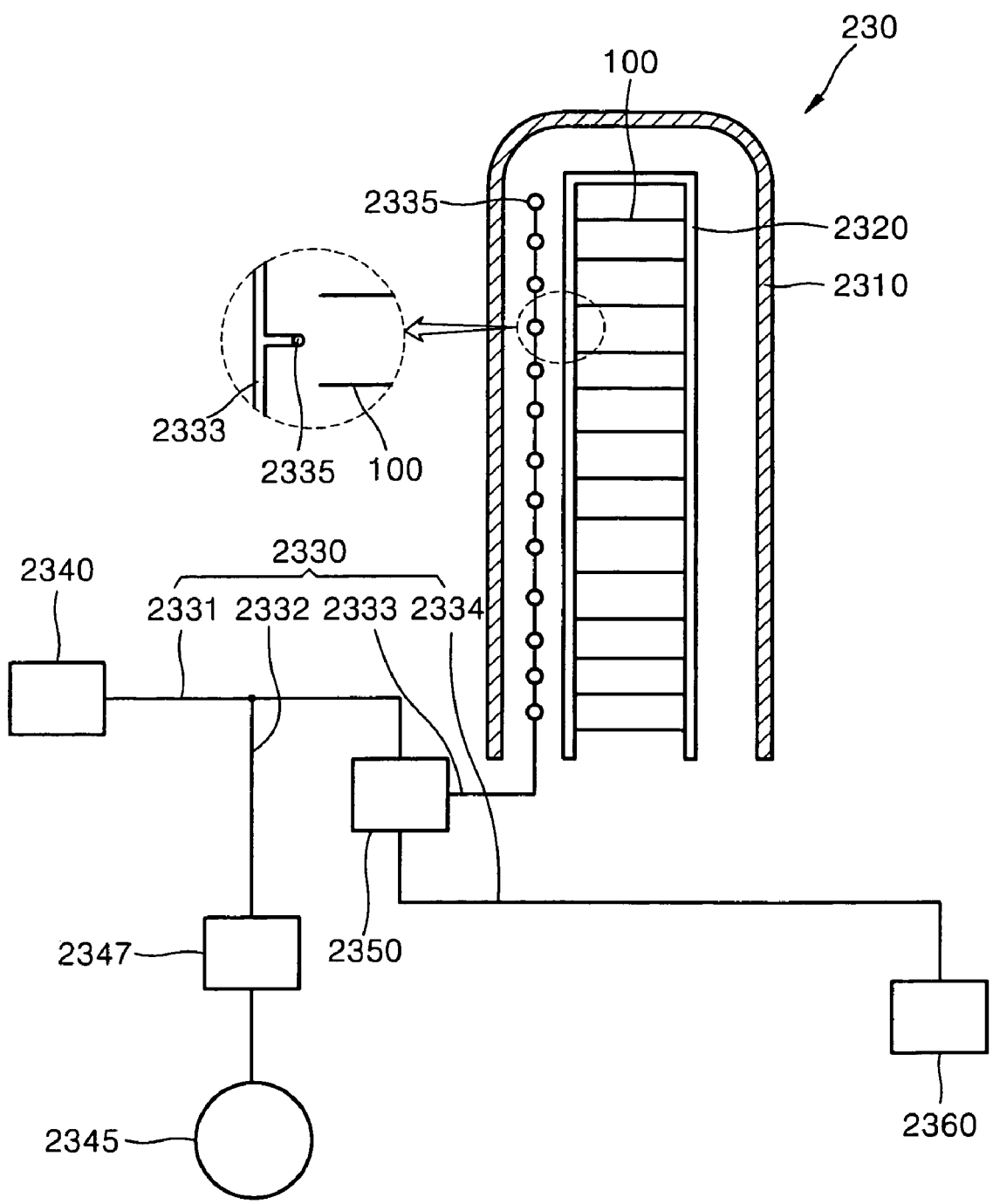
FIG. 3 presents a cross-sectional view of a batch type ALD chamber according to some embodiments of the present invention.

FIG. 3 presents a cross-sectional view of a batch type ALD chamber according to some embodiments of the present invention. Referring to FIG. 3, the batch type ALD chamber 230, which represents the main space of the batch type ALD apparatus, may include a tube 2310 including, but not limited to, a reaction space, a wafer boat 2320, which may be disposed in the tube 2310 and where a plurality of wafers 100 may be loaded, and at least one supply pipe 2330 through which a reaction gas may be supplied to the wafers 100 disposed inside the tube 2310.

Each supply pipe 2330 may include a first supply pipe 2331 connecting a gas source 2340 and a second supply pipe 2332 connecting a vaporizer 2347, which vaporizes a liquid source 2345. The first and second supply pipes 2331 and 2332 may be combined and connect to a three-way valve 2350. The supply pipe 2330 may also include a third pipe 2333 which may connect to a multi-valve, such as a three-way valve, 2350, and may extend inside the tube 2310, and supply the reaction gas to the wafers 100, and a fourth pipe 2334 connected to a multi-valve 2350 and a ventilation opening 2360. The third pipe 2333 may include a plurality of nozzles 2335, which may contribute to a uniform distribution of the reaction gas to the plurality of wafers 100 disposed inside the tube 2310. The nozzles 2335 may be formed at positions corresponding to the wafers 100, i.e., the wafer slots, contributing to uniform distribution of the reaction gas to each of the wafers 100. In some embodiments of the present invention, since the dielectric film may be a metal oxide layer and two reaction sources may be employed, two supply pipes 2330 may be separately installed.

Since the batch type ALD apparatus according to some embodiments of the present invention are designed for a larger caliber wafer, such as a 300 mm wafer, the vaporizer 2347 therein may be larger than a vaporizer for a conventional 200 mm caliber wafer. The vaporizer 2347 in the batch type ALD apparatus according to some embodiments of the present invention may have a higher rate of vaporization of the reaction source, such as about 0.3 or more g/min.

Figure 4:
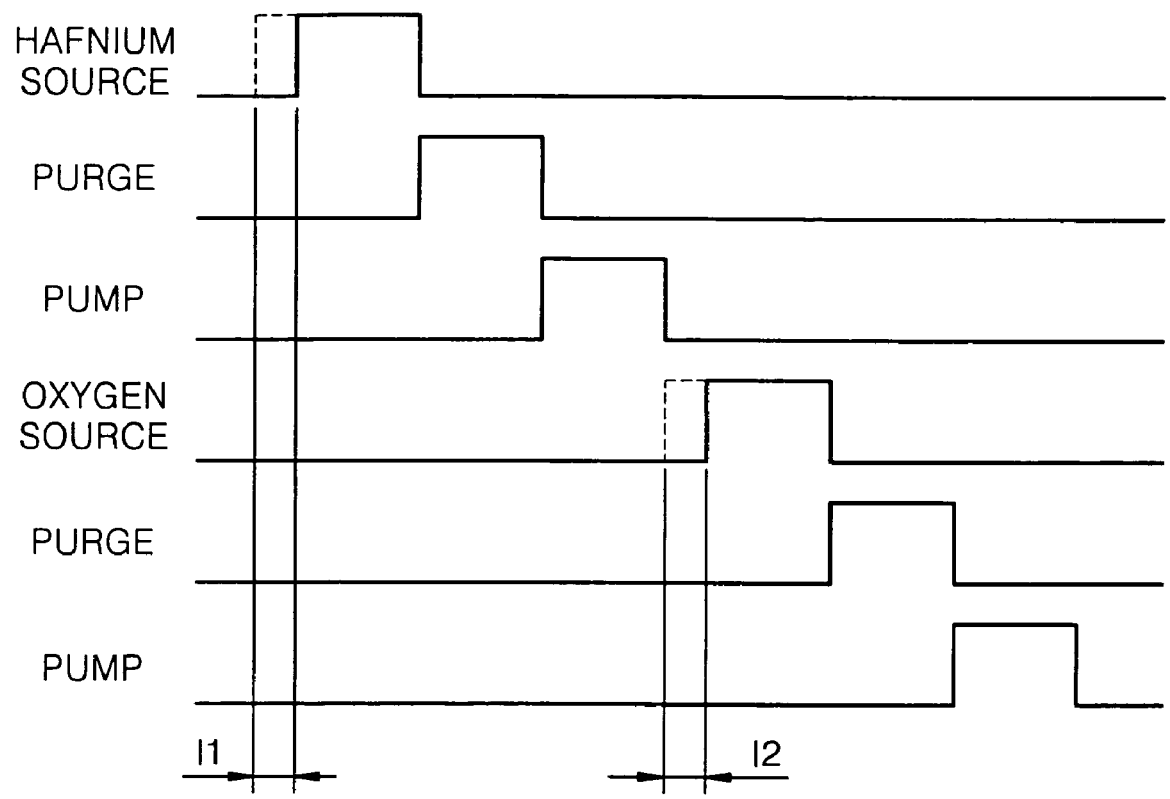
FIG. 4 presents is a timing diagram for illustrating a method of forming a hafnium oxide film according to some embodiments of the present invention.

Methods of forming the first dielectric film using the batch type ALD apparatus are described herein. More specifically, FIG. 4 presents a timing diagram for illustrating a method of forming a hafnium oxide film according to some embodiments of the present invention. Referring to FIG. 4, a process of initiating the vaporizer 2347 may be performed before the first dielectric film is deposited on the lower electrode 110 at time I1. During this process, a first reaction source may be supplied during a predetermined period so as to provide the first dielectric film. During time I1, the multi-valve 2350 may be controlled such that the first reaction gas may not flow into the tube 2310 in which the reaction gas will react, but may be discharged through the ventilation opening 2360. The first dielectric film may include hafnium oxide ($HfO_2$), zirconium oxide ($ZrO_2$), tantalum oxide ($Ta_2O_5$), titanium oxide ($TiO_2$), STO ($St_xBi_yTiO_z$) or a combination thereof, wherein x, y and z represent values that provide suitable ratios of St, Bi and TiO, respectively. In some embodiments of the present invention, the first dielectric film includes hafnium oxide ($HfO_2$). In some embodiments of the present invention, when the first dielectric layer includes $HfO_2$, the first reaction source may be tetrakis ethyl methyl amino hafnium (TEMAH), Hf(OtBu)$_4$, tetrakis di-methyl amino hafnium (TDMAH), or tetrakis di-methyl amino hafnium (TDEAH), and the second reaction source, which oxidizes the first reaction source, may include oxygen, for example, an ozone ($O_3$) source. In some embodiments of the present invention, when the first dielectric layer includes zirconium oxide ($ZrO_2$), the reaction source includes Zr(OtBu)$_4$, tetrakis ethyl methyl amino zirconium (TEMAZ), tetrakis di-methyl amino zirconium (TDMAZ) or tetrakis di-methyl amino zirconium (TDEAZ).

After initiating the vaporizer 2347, the first reaction source may be supplied to the wafer on which the lower electrode 110 is formed for a sufficient period of time, such as a time period in a range of about 60 to 180 seconds, and thus, the first reaction source may be chemically adsorbed onto the surface of the lower electrode 110. The reaction source for depositing hafnium oxide ($HfO_2$) may be supplied to the larger caliber wafer for a longer period of time than the conventional smaller caliber wafer, such as a 200 mm caliber wafer. According to some embodiments of the present invention employing the use of the batch type ALD apparatus, the reaction gas can be sufficiently supplied without a supplying time limitation such that the first reaction source, for example, a hafnium source, can be uniformly adsorbed onto a surface of the lower electrode 110.

A purging process may be performed in order to remove to a desired extent the residual hafnium source which is not chemically adsorbed. The purging process may be accomplished by opening the ventilation opening 2360 performed by operation of the multi-valve 2350. In some embodiments of the present invention, the purging process may be performed for a time period in a range about 60 to 150 seconds.

Since a hafnium oxide layer may be formed in the batch type ALD apparatus according to some embodiments of the present invention, a purging process for each wafer may not be completed. Accordingly, a portion of the first reaction source may not be chemically adsorbed such that a single atomic layer cannot be provided. To remove the residual reaction source after the purging process, the inner space of the tube 2310 may be pumped to form a vacuum. When a pumping process is performed for a time period in a range of about 60 to 150 seconds after the purging process, a single hafnium atom layer 121 may remain on the surface of the lower electrode 110 including little to no impurities.

Figure 1B:
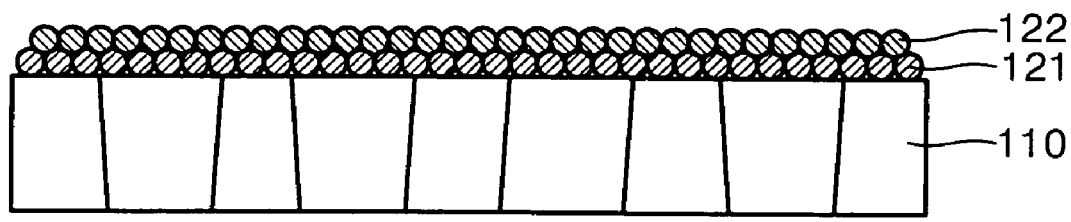

A process of initiating a second reaction source generator, for example, an ozonizer, may be performed by supplying a second reaction source, for example, ozone ($O_3$), for a time period in a range of about 1 to 5 seconds at time 12. The ozone ($O_3$) can be supplied for an additional about 60 to 80 seconds such that oxygen atoms 122 may be chemically adsorbed onto a surface of the hafnium atoms 121. The purging process may be performed for a period of time in a range of about 30 to 100 seconds to control the multi-valve 2350 such that a residual ozone ($O_3$) source that is not chemically adsorbed can be removed to a desirable extent and a single oxygen atom layer can be adsorbed onto the hafnium atoms 121. To accomplish the purging process, a pumping process can be performed for a period of time in a range from about 30 to 100 seconds to form a single oxygen atom layer 122 on the surface of the hafnium atoms 121, as shown in FIG. 1B.

Figure 1C:
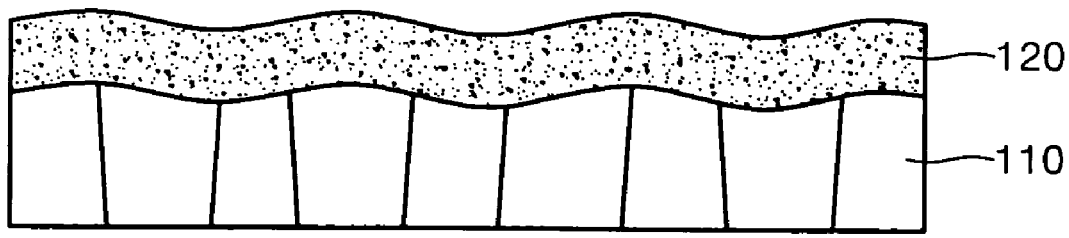

The above-described processes, such as the process of supplying the first reaction source, the purging process, the pumping process, the process of supplying the second reaction source, the purging process, and the pumping process may be repeated until a predetermined depth of hafnium oxide, for example, about 40 to 50Å, can be obtained, thereby providing a first hafnium oxide layer 120, which is the first dielectric film of a capacitor, as shown in FIG. 1C. According to some embodiments of the present invention, the temperature of the tube 2310 for depositing the hafnium oxide layer may be in a range of about 150 to 350° C.

A wafer boat 2320 in which the plurality of wafers 100 having the first hafnium oxide layer 120 are stacked may be discharged and then loaded into the second batch type ALD apparatus. The second batch type ALD apparatus may be a counterpart of the first batch type ALD apparatus in which the first hafnium oxide layer 120 may be deposited, and include the same batch type ALD chamber 230 as in the first batch type ALD apparatus.

Figure 5:
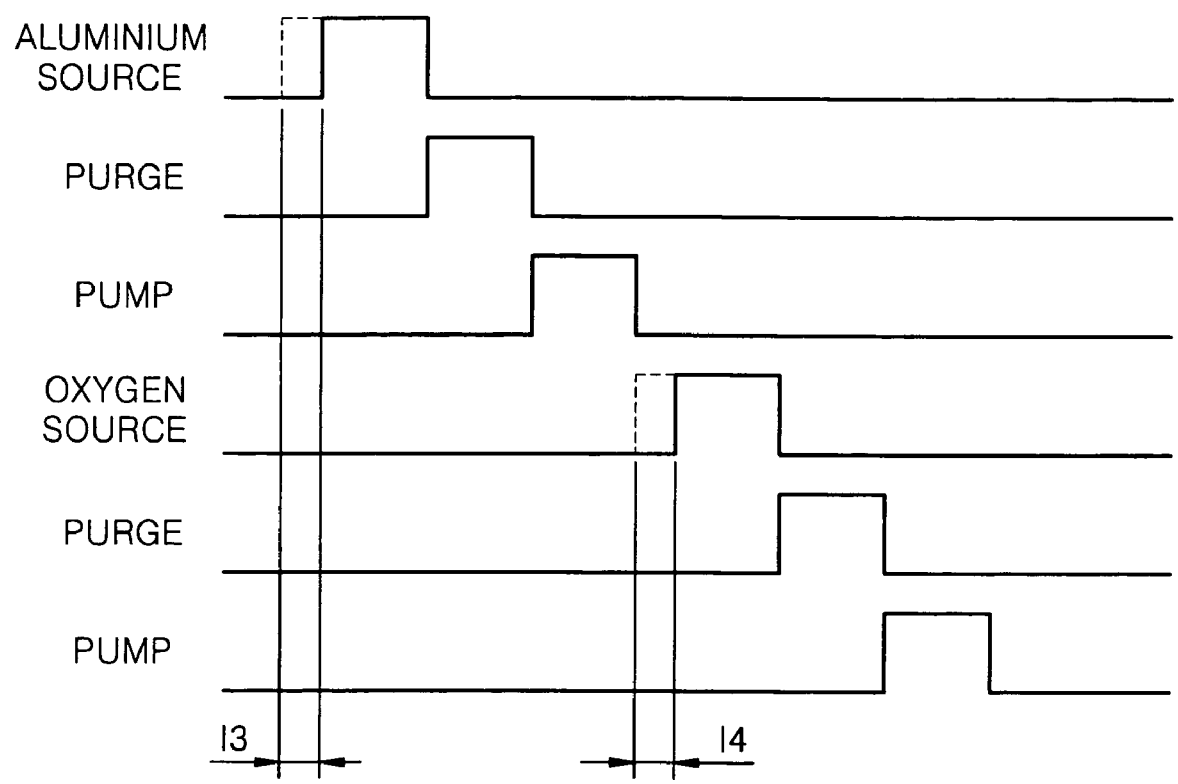
FIG. 5 presents a timing diagram for illustrating a method of forming an aluminum oxide film according to some embodiments of the present invention.

FIG. 5 presents a timing diagram illustrating a method of depositing a second dielectric film, for example, an aluminum oxide layer, on the first hafnium oxide layer 120 according to some embodiments of the present invention. In a process of initiating the vaporizer 2347, an aluminum source, i.e., a first reaction source, for example, may be supplied for a time period in a range of about 3 to 7 seconds at time 13. The aluminum source, for example, TMA (trimethyl aluminum (TMA) may be supplied for a period of time in a range of about 50 to 150 seconds in order to provide an aluminum atomic layer. The inside of tube 2310 may be purged for a period of time in a range of about 50 to 100 seconds such that a single aluminum atom layer is chemically adsorbed onto a top surface of the first hafnium oxide layer 120, and then pumped for a period of time in a range of about 50 to 100 seconds. Accordingly, the single aluminum atom layer may be chemically adsorbed onto the top surface of the first hafnium oxide layer 120.

Figure 1D:
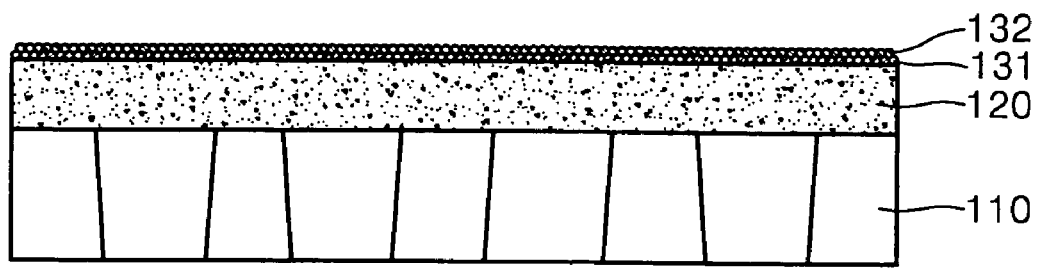
Figure 1E:
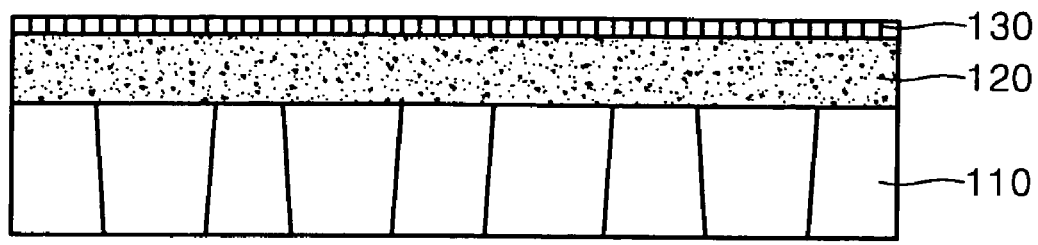
Figure 1F:
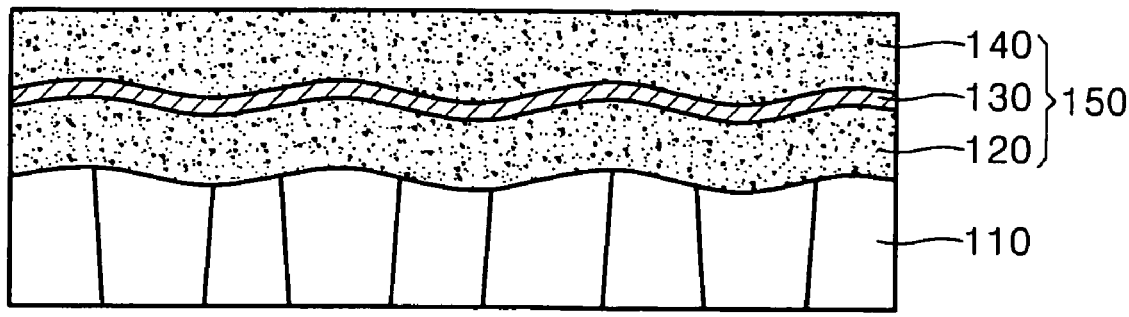

According to some embodiments of the present invention, an oxygen source, i.e., a second reaction source, for example, an ozone ($O_3$) source may be supplied for a period of time in a range of about 1 to 3 seconds at time 14 to initiate an ozonizer in the batch type ALD chamber 230. The ozone ($O_3$) source may be supplied for a period of time in a range of about 40 to 160 seconds such that oxygen atoms may be chemically adsorbed onto aluminum atoms 131. The purging process may be performed for a period of time in a range of about 20 to 80 seconds when the multi-valve 2350 and the ventilation opening 2360 are open. The pumping process may be performed for a period of time in a range of about 20 to 80 seconds such that a single oxygen atom layer 132 may be chemically adsorbed onto the aluminum atoms 131, as shown in FIG. 1D. The process of supplying the first reaction source, the purging process, the pumping process, the process of supplying the second reaction source, the purging process, and the pumping process may be repeated until a predetermined depth of aluminum oxide, for example, about 5 to 15Å, may be obtained, thereby providing an aluminum oxide layer 130, as shown in FIG. 1E.

The temperature in the batch type ALD chamber 230 for forming the aluminum oxide layer 130 may be higher than in the batch type ALD chamber 230 for forming the hafnium oxide layer 120, for example, in a range between about 350 to 500° C., such that the aluminum oxide layer 130 may have more dense layer characteristics and a higher crystallization temperature.

Although the aluminum oxide layer 130 may be used as the second dielectric film in some embodiments of the present invention, any layer having a higher crystallization temperature than the hafnium oxide layer, i.e., the first dielectric film, can be used. That is, the second dielectric film may include aluminum oxide ($Al_2O_3$), lanthanum oxide ($La_2O_3$), praseodymium oxide ($Pr_2O_3$) or a combination thereof.

Referring again to FIG. 1F, the wafer boat 2320 having wafers 100 including aluminum oxide layers 130 that may be loaded therein can be transported into a third batch type ALD chamber to form hafnium oxide layers, i.e., third dielectric films. The batch type ALD chamber into which the wafer boat 2320 may be transported may be the batch type ALD chamber 230 in which the first hafnium oxide layer 120 may be formed or a different batch type ALD chamber. The second hafnium oxide layer 140 may be formed using the same or similar method at the same or similar temperature by which the first hafnium oxide layer 120 may be formed. The second hafnium oxide layer 140 may have a thickness in a range of about 30 to 40Å, which is less than the thickness of the first hafnium oxide layer 120, at least in part, because a first hafnium oxide layer 120 of greater thickness formed on the surface of the lower electrode 110 having a high aspect ratio may reduce or prevent leakage current.

After forming the first dielectric film, for example, a first hafnium oxide layer 120, the second dielectric film, for example, an aluminum oxide layer 130, and the third dielectric film, for example, a second hafnium oxide layer 140, which together can form a capacitor dielectric film 150 using the batch type and ex-situ method, a post-treatment process of the dielectric film may be performed to reduce or prevent the leakage current of the capacitor dielectric film 150. The dielectric film post-treatment process may include a direct plasma treatment process, a remote plasma treatment process, or a modified magnetron type (MMT) plasma treatment process. Additionally, the post-treatment process may be performed at a temperature in a range of about 150 to 400° C., in some embodiments, about 250° C., and at a pressure of about several Torr, for example, about 1.5 Torr for about 3 to 8 minutes, in a gas atmosphere including $O_2$, $N_2$, $NH_3$, $H_2$, $N_2O$ or a combination thereof.

Figure 1G:
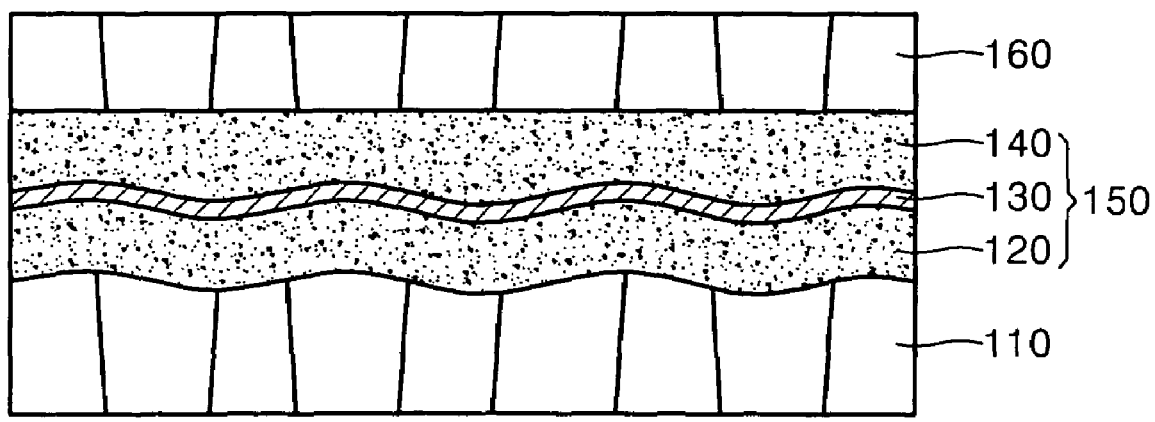

Referring to FIG. 1G, an upper electrode 160 may be formed on the capacitor dielectric film 150. Similar to the lower electrode 110, the upper electrode 160 may include a metal nitride layer formed using a CVD, ALD or SFD process.

Embodiments of the present invention will now be described in more detail in the following non-limiting example.

EXAMPLES

Example 1

Figure 6:
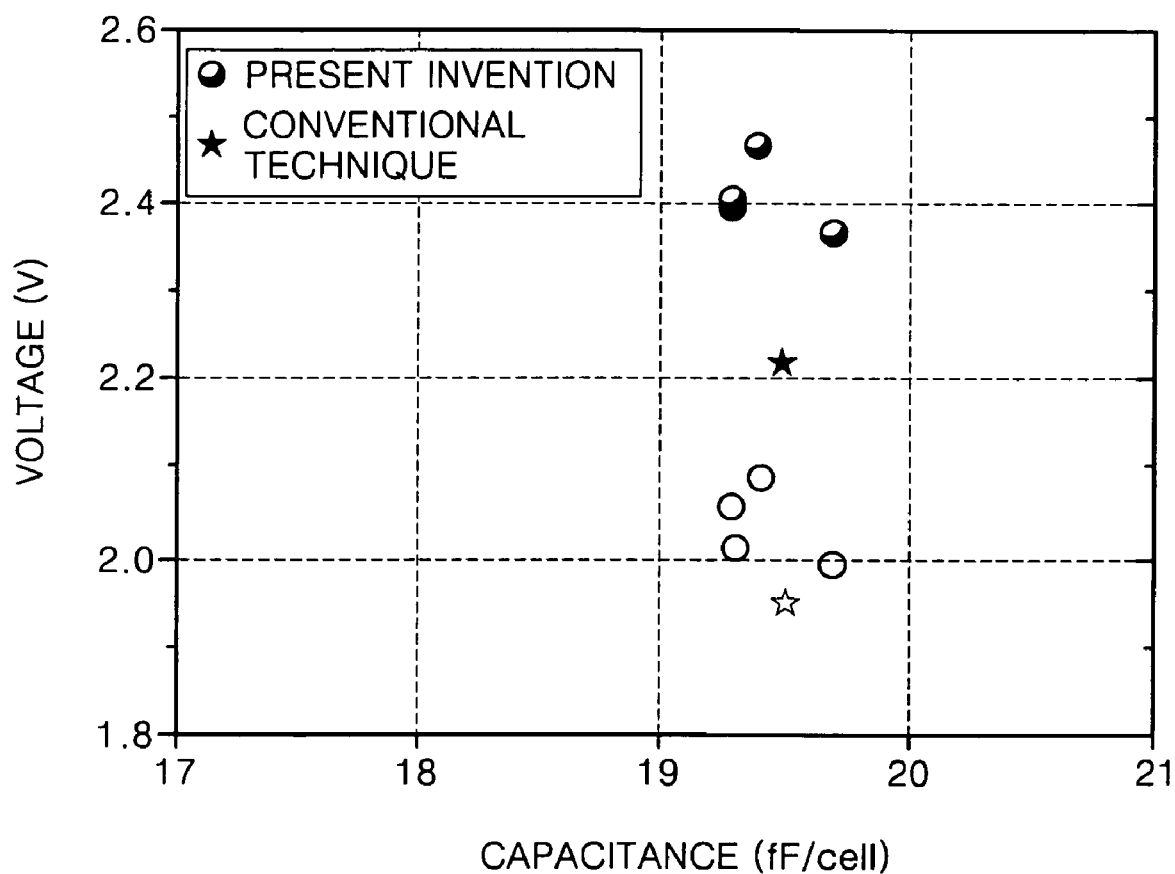
FIG. 6 presents a graph illustrating leakage current of a capacitor according to some embodiments of the present invention.

FIG. 6 presents a graph illustrating a degree of leakage current of a capacitor dielectric film according to some embodiments of the present invention in conjunction with results of a conventional capacitor dielectric film. In FIG. 6, the x-axis indicates capacitances (fF/cell) of the layers at −0.9V, and the y-axis indicates voltages corresponding to 1fA/cell. The leakage current can be estimated with a voltage corresponding to 1fA/cell. Reference symbols ● and ○ in FIG. 6 indicate results when a first hafnium oxide layer 120 of about a 40Å thickness, an aluminum oxide layer 130 of about a 5Å thickness and a second hafnium oxide layer 140 of about a 40Å thickness are formed using the batch type ALD apparatus according to embodiments of the present invention, and reference symbols ★ and ☆ in FIG. 6 indicate a first hafnium oxide layer 120 of about a 40Å thickness, an aluminum oxide layer 130 of about a 5 Å thickness, and a second hafnium oxide layer 140 of about a 40 Å thickness are formed using the conventional single type ALD apparatus.

Referring to FIG. 6, the capacitor dielectric film formed using the batch type ALD apparatus according to embodiments of the present invention present a higher voltage corresponding to 1fA/Cell than the capacitor dielectric film formed using the conventional single type ALD apparatus. Therefore, the leakage current of the capacitor dielectric film formed using the batch type ALD apparatus according to some embodiments of the present invention is lower than that of the capacitor dielectric film formed using the conventional single type ALD apparatus.

Example 2

Figure 7A:
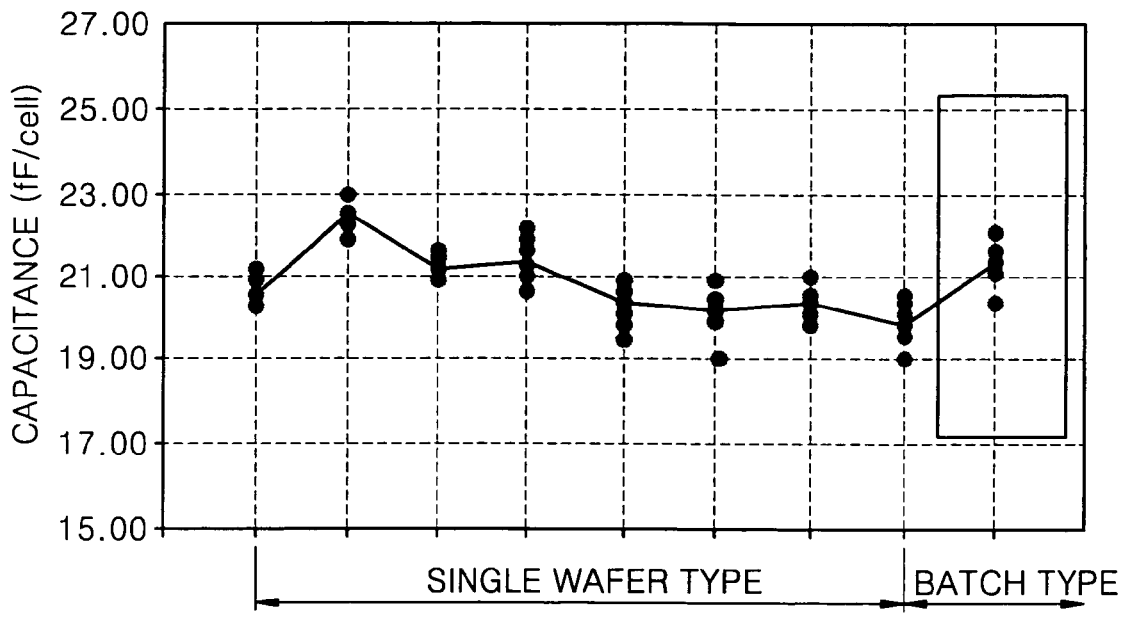
FIGS. 7A and 7B present graphs illustrating relationships between leakage current and breakdown voltage with respect to some embodiments of the present invention with reference to a conventional technique.
Figure 7B:
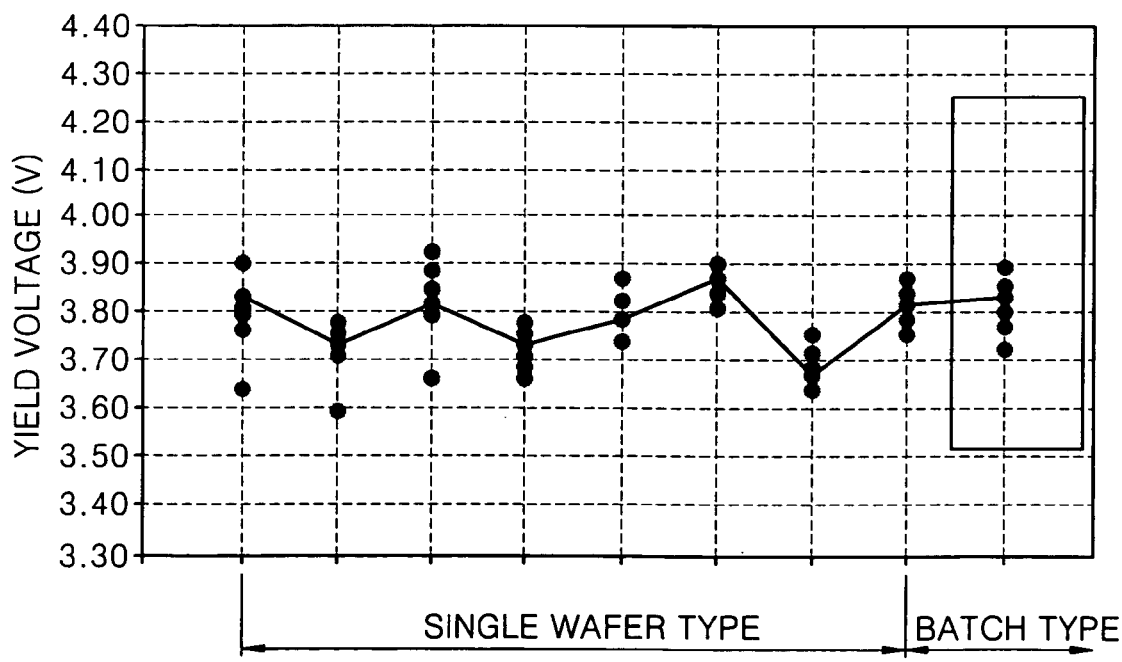

FIG. 7A presents a graph illustrating capacitances of a capacitor in which a dielectric film is formed using the batch type ALD apparatus according to some embodiments of the present invention in conjunction with capacitances of capacitors in which dielectric films are formed using a conventional single type ALD apparatus. FIG. 7B presents a graph illustrating breakdown voltages of the capacitor in which the dielectric film is formed using the batch type ALD apparatus according to embodiments of the present invention in conjunction with breakdown voltages of the capacitors in which dielectric films are formed using a conventional single type ALD apparatus.

Referring to FIG. 7A, the capacitances of the capacitor in which the dielectric film is formed using the batch type ALD apparatus according to some embodiments of the present invention and the capacitors in which dielectric films are formed using a conventional single type ALD apparatus are about 20 through 23 fF/cell.

Referring to FIG. 7B, the breakdown voltage of the capacitor in which the dielectric film is formed using the batch type ALD apparatus according to embodiments of the present invention and the breakdown voltage of capacitors in which dielectric films are formed using a conventional single type ALD apparatus are about 3.6 to 4.0 nBV for both cases.

The capacitance is inversely proportional to the thickness of the dielectric film, but the breakdown voltage is proportional to the thickness of a dielectric film. Therefore, it may be problematic to find an optimum condition with respect to the capacitance and the breakdown voltage which represents the leakage current.

However, referring to FIGS. 7A and 7B, the capacitor in which the dielectric film is formed using the batch type ALD apparatus according to some embodiments of the present invention has a capacitance of at least an average level compared to capacitors in which dielectric films are formed using a conventional single type ALD apparatus. Consequently, the capacitor in which the dielectric film is formed using the batch type ALD apparatus according to some embodiments of the present invention can show higher capacitance and improved leakage current characteristics.

As described above, according to some embodiments of the present invention, a capacitor dielectric film having a hafnium oxide layer/aluminum oxide layer/hafnium oxide layer structure may be formed ex-situ in the batch type ALD apparatus according to embodiments of the present invention.

According to some embodiments of the present invention, a dielectric film in a capacitor may be formed using a batch type ALD apparatus, thereby improving throughput of the capacitor. In addition, even if the source supplying time is sufficiently extended, a plurality of wafers can be treated, and thus, the process time is not limited in contrast to that observed using a conventional single type ALD apparatus. Accordingly, since a sufficient source supplying time is possible, step coverage and loading effects can be improved.

Since the hafnium oxide layers and the aluminum oxide layer may be formed ex-situ, the hafnium oxide layers and the aluminum oxide layer can be deposited in an optimum condition. For example, the aluminum oxide layer may be deposited at a higher temperature than the hafnium oxide layers, and thus a higher crystallization temperature of the aluminum oxide layer can be obtained. Accordingly, crystallization of the hafnium oxide layer may be retarded when a higher temperature back-end process is performed, thereby reducing or preventing the generation of leakage current.

The method according to some embodiments of the present invention further include a pumping process after a purging process so as to improve the characteristics of the purging process when a larger caliber wafer, such as a 300 mm wafer, is used, thereby reducing or removing residual atomic layers and impurities.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A method of manufacturing a dielectric film comprising:
   forming a first dielectric film on a wafer using atomic layer deposition in a first batch type apparatus;
   forming a second dielectric film on the first dielectric film using atomic layer deposition in a second batch type apparatus, wherein the second dielectric film has a higher crystallization temperature than the first dielectric film; and
   forming a third dielectric film on the second dielectric film using atomic layer deposition in a third batch type apparatus.

2. The method of claim 1, wherein forming the first dielectric film, the second dielectric film, and the third dielectric film each independently comprise:
   chemically absorbing a first reaction source into the wafer;
   purging a chemically unabsorbed residual first reaction source;
   pumping a reaction space where an atomic layer is deposited to remove an unpurged residual first reaction source;
   supplying a second reaction source to react with the first reaction source to form an atomic layer;
   purging an unreacted residual second reaction source; and
   pumping the reaction space to remove the unpurged residual second reaction source.

3. The method of claim 2 further comprising initiating a vaporizer which vaporizes the first reaction source prior to the chemical adsorption of the first reaction source into the wafer.

4. The method of claim 3, wherein the first reaction source is transported into the vaporizer and not into the reaction space during initiation of the vaporizer.

5. The method of claim 2 further comprising initiating a second reaction source generator between (a) pumping the reaction space to remove the unpurged residual first reaction source and (b) supplying the second reaction source for forming the atomic layer.

6. The method of claim 5, wherein during the initiation phase of the second reaction source generator, the second reaction source is transported into the second reaction source and not into the reaction space.

7. The method of claim 2, wherein the first and third dielectric films are formed with the same reaction source in the same apparatus.

8. The method of claim 7, wherein the first and third dielectric films are selected from the group consisting of hafnium oxide ($HfO_2$), zirconium oxide ($ZrO_2$), tantalum oxide ($Ta_2O_5$), titanium oxide ($TiO_2$), STO ($St_xBi_yTiO_z$) and a combination thereof.

9. The method of claim 8, wherein when the first and third dielectric films comprise hafnium oxide layers, the first reaction source is selected from the group consisting of tetrakis ethyl methyl amino hafnium (TEMAH), tetrakis di-methyl amino hafnium ($Hf(OtBu)_4$, TDMAH) and tetrakis di-methyl amino hafnium (TDEAH), and the second reaction source comprises ozone ($O_3$).

10. The method of claim 8, wherein the first and third dielectric films are formed at a temperature in a range of about 150 to 300° C.

11. The method of claim 2, wherein the second dielectric film is selected from the group consisting of aluminum oxide ($Al_2O_3$) lanthanum oxide ($La_2O_3$), praseodymium oxide ($Pr_2O_3$) and a combination thereof.

12. The method of claim 11, wherein when the second dielectric film comprises an aluminum oxide layer, the first reaction source comprises tri-methyl aluminum (TMA) and the second reaction source comprises ozone ($O_3$).

13. The method of claim 11, wherein the second dielectric film is formed at a temperature in a range of about 350 to 500° C.

14. The method of claim 1, wherein a thickness of the first dielectric film is equal to or greater than a thickness of the third dielectric film.

15. A method of manufacturing a metal-insulator-metal (MIM) capacitor comprising:
   forming a plurality of lower electrodes on a semiconductor substrate;
   loading a plurality of semiconductor substrates having the lower electrodes formed in a first batch type apparatus and forming first dielectric films using atomic layer deposition;
   loading a plurality of semiconductor substrates having the first dielectric films formed in a second batch type apparatus and forming second dielectric films on the first dielectric films using atomic layer deposition, wherein the second dielectric films have a higher crystallization temperature than the first dielectric films;
   loading a plurality of semiconductor substrates having the second dielectric films formed in a third batch type apparatus and forming third dielectric films on the second dielectric films using the atomic layer deposition; and
   forming upper electrodes on the third dielectric films.

16. The method of claim 15, wherein forming the first dielectric film, the second dielectric film, and the third dielectric film comprise:
   chemically absorbing a first reaction source into the wafer;
   purging a chemically unabsorbed residual first reaction source;
   pumping a reaction space where an atomic layer is deposited to remove the unpurged residual first reaction source;
   supplying a second reaction source to react with the first reaction source to form an atomic layer;
   purging an unreacted residual second reaction source; and
   pumping the reaction space to remove an unpurged residual second reaction source.

17. The method of claim 16 further comprising initiating a vaporizer which vaporizes the first reaction source prior to the chemical adsorption of the first reaction source into the semiconductor substrates.

18. The method of claim 16 further comprising initiating a second reaction source generator between (a) pumping the reaction space to remove the unpurged residual first reaction source and (b) supplying the second reaction source for forming the atomic layer.

19. The method of claim 16, wherein the first and third dielectric films are formed with the same reaction source in the same batch type ALD apparatus.

20. The method of claim 19, wherein the first and third dielectric films are selected from the group consisting of hafnium oxide ($HfO_2$), zirconium oxide ($ZrO_2$), tantalum oxide ($Ta_2O_5$), titanium oxide ($TiO_2$), STO ($St_xBi_yTiO_z$) and a combination thereof.

21. The method of claim 20, wherein the first and third dielectric films are formed at a temperature in a range of about 150 to 300° C.

22. The method of claim 16, wherein the second dielectric film is selected from the group consisting of aluminum oxide ($Al_2O_3$), lanthanum oxide ($La_2O_3$), praseodymium oxide ($Pr_2O_3$) and a combination thereof.

23. The method of claim 22, wherein the second dielectric film is formed at a temperature in a range of about 350 to 500° C.

24. The method of claim 15, wherein a thickness of the first dielectric film is equal to or greater than a thickness of the third dielectric film.

25. The method of claim 24, wherein the first dielectric film is formed at a thickness in a range of about 40 to 50Å, the second dielectric film is formed at a thickness in a range of about 5 to 15Å, and the third dielectric film is formed at a thickness in a range of 30 to 40Å.

26. The method of claim 15, wherein the lower electrodes and the upper electrodes comprise a metal nitride further selected from the group consisting of titanium nitride (TiN), tungsten nitride (WN) and tantalum nitride (TaN), or a metal selected from the group consisting of ruthenium (Ru), platinum (Pt) or iridium (Ir).

27. The method of claim 15 further comprising plasma post-treating the dielectric film between forming the third dielectric film and forming the upper electrodes.

28. The method of claim 27, wherein the plasma post-treatment of the dielectric film is performed at a temperature in a range of about 150 to 400° C. in a gas atmosphere, wherein the gas is selected from the group consisting of $O_2$, $N_2$, $NH_3$, $H_2$, $N_2O$ and a combination thereof.

29. A method of manufacturing a dielectric film comprising:
    forming a plurality of first dielectric films on a plurality of wafers with at least one repetition of supplying a first reaction source to a reaction space and purging and pumping the first reaction source from the reaction space, and further supplying a second reaction source to the reaction space and, purging and pumping the second reaction source from the reaction space;
    forming a plurality of second dielectric films on the plurality of wafers on each of which a first dielectric film is formed with at least one repetition of supplying a third reaction source to a reaction space and purging and pumping the third reaction source from the reaction space, and further supplying a fourth reaction source to the reaction space and purging and pumping the fourth reaction source from the reaction space; and
    forming a plurality of third dielectric films on the plurality of wafers on each of which a second dielectric film is formed simultaneously with at least one repetition of supplying a fifth reaction source to a reaction space and purging and pumping the fifth reaction source from the reaction space, and further supplying a sixth reaction source to the reaction space and purging and pumping the sixth reaction source from the reaction space,
    wherein the first dielectric films and the second dielectric films are formed in different chambers.

30. A method of manufacturing a dielectric film comprising:
    forming a plurality of hafnium oxide layers on a plurality of wafers at a first temperature with at least one repetition of supplying a hafnium source to a reaction space and purging and pumping the hafnium source from the reaction space, and further supplying an oxygen source to the reaction space and purging and pumping the oxygen source from the reaction space;
    forming a plurality of aluminum oxide layers on the plurality of wafers on each of which a hafnium oxide layer is formed at a second temperature, which is higher than the first temperature with at least one repetition of supplying an aluminum source to a reaction space and purging and pumping the aluminum source from the reaction space, and further supplying an oxygen source to the reaction space and purging and pumping the oxygen source from the reaction space; and
    forming a plurality of hafnium oxide layers on the plurality of wafers on each of which an aluminum oxide layer is formed simultaneously at the first temperature with at least one repetition of supplying a hafnium source to a reaction space and purging and pumping the hafnium source from the reaction space, and further supplying an oxygen source to the reaction space and purging, and pumping the oxygen source from the reaction space,
    wherein the first dielectric films and the second dielectric films are formed in the different chambers.

31. The method of claim 30, wherein the first temperature is in a Range of about 150 to 350° C. and the second temperature is in a range of about 350 to 500° C.

32. The method of claim 30, wherein forming the plurality of first, second and third dielectric films is carried out simultaneously with the at least one repetition of procedures recited in claim 30.

* * * * *